United States Patent
Shih et al.

(10) Patent No.: US 10,497,616 B2
(45) Date of Patent: *Dec. 3, 2019

(54) EMBEDDED 3D INTERPOSER STRUCTURE

(71) Applicant: Taiwan Semiconductor Manufacturing Company, Ltd., Hsinchu (TW)

(72) Inventors: Ying-Ching Shih, Hsinchu (TW); Jing-Cheng Lin, Zhudong Township (TW); Wen-Chih Chiou, Zhunan Township (TW); Shin-Puu Jeng, Po-Shan Village (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/014,821

(22) Filed: Jun. 21, 2018

(65) Prior Publication Data

US 2018/0301376 A1 Oct. 18, 2018

Related U.S. Application Data

(63) Continuation of application No. 13/867,831, filed on Apr. 22, 2013, now Pat. No. 10,049,928, which is a
(Continued)

(51) Int. Cl.
*H01L 21/768* (2006.01)
*H01L 23/498* (2006.01)
(Continued)

(52) U.S. Cl.
CPC ...... *H01L 21/76885* (2013.01); *H01L 21/486* (2013.01); *H01L 21/56* (2013.01); *H01L 23/147* (2013.01); *H01L 23/49827* (2013.01); *H01L 23/5389* (2013.01); *H01L 24/94* (2013.01); *H01L 24/97* (2013.01); *H01L 25/0657* (2013.01); *H05K 1/185* (2013.01); *H05K 3/4007* (2013.01); *H01L 23/13* (2013.01); *H01L 23/3128* (2013.01); *H01L 23/49816* (2013.01); *H01L 2224/04105* (2013.01); *H01L 2224/11002* (2013.01); *H01L 2224/12105* (2013.01); *H01L 2224/13025* (2013.01);
(Continued)

(58) Field of Classification Search
CPC ............. H01L 21/76885; H01L 21/486; H01L 23/147
See application file for complete search history.

(56) References Cited

U.S. PATENT DOCUMENTS 4,122,113 A 10/1978 Turner
4,811,082 A 3/1989 Jacobs et al.
(Continued)

*Primary Examiner* — Tucker J Wright
*Assistant Examiner* — Wilner Jean Baptiste
(74) *Attorney, Agent, or Firm* — Slater Matsil, LLP

(57) ABSTRACT

A device includes an interposer, which includes a substrate; and at least one dielectric layer over the substrate. A plurality of through-substrate vias (TSVs) penetrate through the substrate. A first metal bump is in the at least one dielectric layer and electrically coupled to the plurality of TSVs. A second metal bump is over the at least one dielectric layer. A die is embedded in the at least one dielectric layer and bonded to the first metal bump.

20 Claims, 16 Drawing Sheets

Related U.S. Application Data continuation of application No. 12/823,851, filed on Jun. 25, 2010, now Pat. No. 8,426,961.

(51) Int. Cl.

| | | |
|---|---|---|
| *H01L 21/48* | (2006.01) | |
| *H01L 23/14* | (2006.01) | |
| *H01L 23/538* | (2006.01) | |
| *H01L 25/065* | (2006.01) | |
| *H01L 21/56* | (2006.01) | |
| *H01L 23/00* | (2006.01) | |
| *H05K 1/18* | (2006.01) | |
| *H05K 3/40* | (2006.01) | |
| *H01L 23/13* | (2006.01) | |
| *H01L 23/31* | (2006.01) | |
| *H05K 1/03* | (2006.01) | |

(52) U.S. Cl.
CPC ............... *H01L 2224/14181* (2013.01); *H01L 2224/16145* (2013.01); *H01L 2224/16148* (2013.01); *H01L 2224/16225* (2013.01); *H01L 2224/16238* (2013.01); *H01L 2224/2518* (2013.01); *H01L 2224/32145* (2013.01); *H01L 2224/32225* (2013.01); *H01L 2224/73204* (2013.01); *H01L 2224/73267* (2013.01); *H01L 2224/82* (2013.01); *H01L 2224/92244* (2013.01); *H01L 2224/94* (2013.01); *H01L 2224/97* (2013.01); *H01L 2225/06513* (2013.01); *H01L 2225/06517* (2013.01); *H01L 2225/06524* (2013.01); *H01L 2225/06548* (2013.01); *H01L 2924/01322* (2013.01); *H01L 2924/14* (2013.01); *H01L 2924/15153* (2013.01); *H01L 2924/181* (2013.01); *H05K 1/0306* (2013.01); *H05K 2203/016* (2013.01); *H05K 2203/025* (2013.01)

(56) References Cited

U.S. PATENT DOCUMENTS

| | | | |
|---|---|---|---|
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 5,973,396 A | 10/1999 | Farnworth | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,355,273 B2 | 4/2008 | Jackson et al. | |
| 7,402,442 B2 | 7/2008 | Condorelli et al. | |
| 7,402,515 B2 | 7/2008 | Arana et al. | |
| 7,410,884 B2 | 8/2008 | Ramananthan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,741,148 B1 | 6/2010 | Marimuthu et al. | |
| 7,834,450 B2 | 11/2010 | Kang | |
| 7,956,442 B2 | 6/2011 | Hsu et al. | |
| 2003/0164543 A1* | 9/2003 | Kheng Lee | H01L 23/3677 257/706 |
| 2004/0262735 A1* | 12/2004 | Higashi et al. | H01L 23/5389 257/686 |
| 2005/0046002 A1 | 3/2005 | Lee et al. | |
| 2005/0051883 A1 | 3/2005 | Fukazawa | |
| 2005/0170600 A1 | 8/2005 | Fukuzo | |
| 2008/0011508 A1 | 1/2008 | Sunohara et al. | |
| 2009/0224391 A1 | 9/2009 | Lin et al. | |
| 2009/0243083 A1 | 10/2009 | Han et al. | |
| 2010/0044853 A1 | 2/2010 | Dekker et al. | |
| 2010/0133704 A1* | 6/2010 | Marimuthu | H01L 21/565 257/778 |
| 2010/0308443 A1 | 12/2010 | Suthiwongsunthom et al. | |

\* cited by examiner

EMBEDDED 3D INTERPOSER STRUCTURE

PRIORITY CLAIM AND CROSS-REFERENCE

This application is a continuation of U.S. patent application Ser. No. 13/867,831, filed on Apr. 22, 2013 and entitled "Embedded 3D Interposer Structure," which is a continuation of U.S. patent application Ser. No. 12/823,851, filed on Jun. 25, 2010, and entitled "Embedded 3D Interposer Structure," now U.S. Pat. No. 8,426,961 issued on Apr. 23, 2013, which applications are hereby incorporated herein by reference.

TECHNICAL FIELD

This disclosure relates generally to integrated circuits, and more particularly to three-dimensional integrated circuits (3DIC) comprising interposers and the method of forming the same.

BACKGROUND

The integration density of various electronic components (i.e., transistors, diodes, resistors, capacitors, etc.) has experienced continuous rapid increase. For the most part, the improvement in integration density has come from repeated reductions in minimum feature size, allowing more components to be integrated into a given chip area.

The integration improvement is essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

Three-dimensional integrated circuits (3DICs) were thus formed, wherein dies may be stacked, with wire-bonding, flip-chip bonding, and/or through-silicon vias (TSV) used to connect the dies together and to connect the dies to package substrates. The conventional 3DICs, however, have a high form factor.

SUMMARY

In accordance with one aspect, a device includes device includes an interposer, which includes a substrate; and at least one dielectric layer over the substrate. A plurality of through-substrate vias (TSVs) penetrate through the substrate. A first metal bump is in the at least one dielectric layer and electrically coupled to the plurality of TSVs. A second metal bump is over the at least one dielectric layer. A die is embedded in the at least one dielectric layer and bonded to the first metal bump.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel three-dimensional integrated circuit (3DIC) and the method of forming the same are provided. The intermediate stages of manufacturing an embodiment are illustrated. The variations of the embodiment are discussed. Throughout the various views and illustrative embodiments, like reference numbers are used to designate like elements.

Figure 1A:
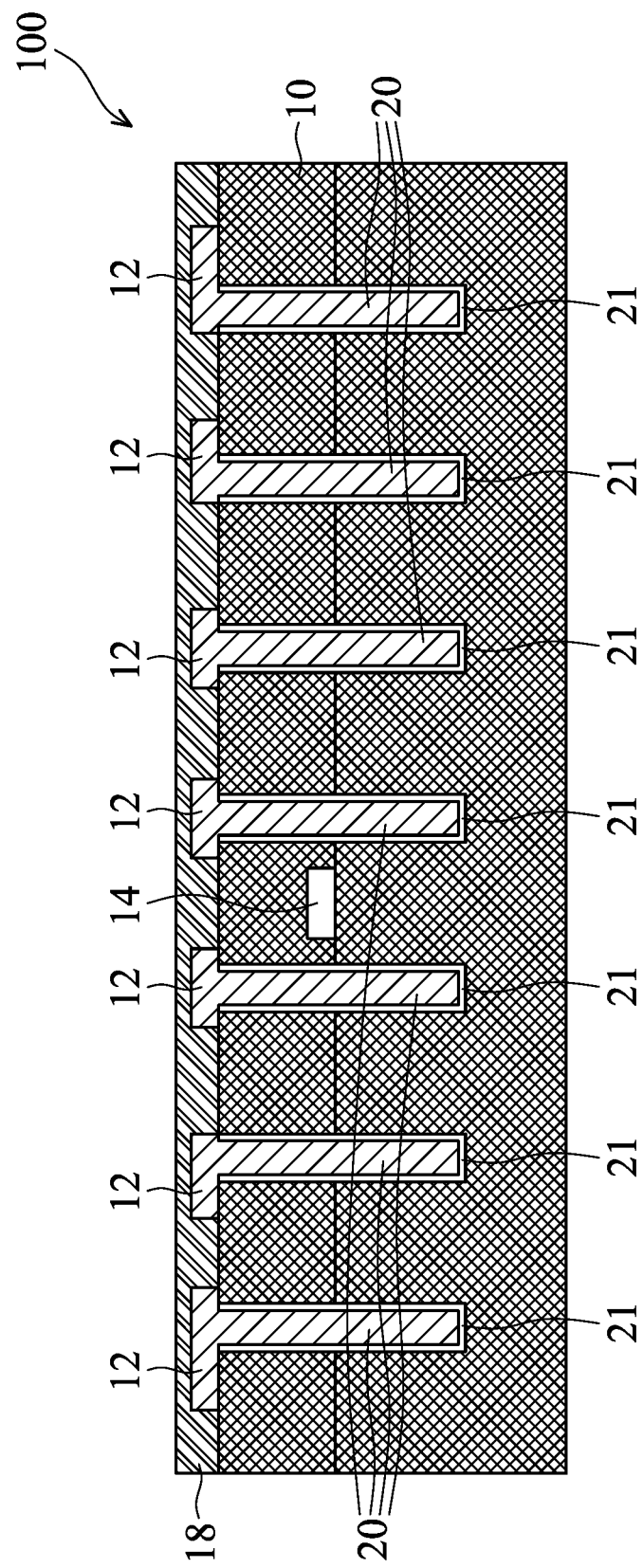
FIGS. 1A through 1G are cross-sectional views of intermediate stages in the manufacturing of a three-dimensional integrated circuit (3DIC) in accordance with various embodiments, wherein a die is embedded in dielectric layers on a side of an interposer.

Referring to FIG. 1A, substrate 10 is provided. Throughout the description, substrate 10 and the corresponding dielectric layers and metal features formed on the opposite sides of substrate 10 are referred to as interposer wafer 100. Substrate 10 may be formed of a semiconductor material, such as silicon, silicon germanium, silicon carbide, gallium arsenide, or other commonly used semiconductor materials. Alternatively, substrate 10 is formed of a dielectric material such as silicon oxide. Interposer wafer 100 may include, or may be substantially free from, active devices such as transistors. FIG. 1A schematically illustrates active devices 14, which may be formed at a surface of substrate 10. Furthermore, interposer wafer 100 may include, or may be free from, passive devices such as capacitors, resistors, inductors, and/or the like. Through-substrate vias (TSVs) 20 are formed in substrate 10, and insulation layers 21 may be formed to electrically insulate TSVs 20 from substrate 10.

Redistribution lines (RDLs) 12 are formed over substrate 10, and are electrically coupled to TSVs 20. RDLs 12 may include metal lines for routing electrical signal and metal pads for landing the subsequently formed vias. In an embodiment, RDLs 12 are formed of copper, although they can also be formed of other metals such as aluminum, silver, titanium, tantalum, tungsten, nickel, and/or alloys thereof. Throughout the description, the side of interposer wafer 100 facing up in FIG. 1A is referred to as a front side, and the side facing down is referred to as a backside. Dielectric layer 18 is formed over RDLs 12, and forms a planar top surface. The materials for forming dielectric layer 18 may include nitrides, a polyimide, organic materials, inorganic materials, and the like. After the formation of dielectric layer 18, RDLs 12 are covered.

Figure 1B:
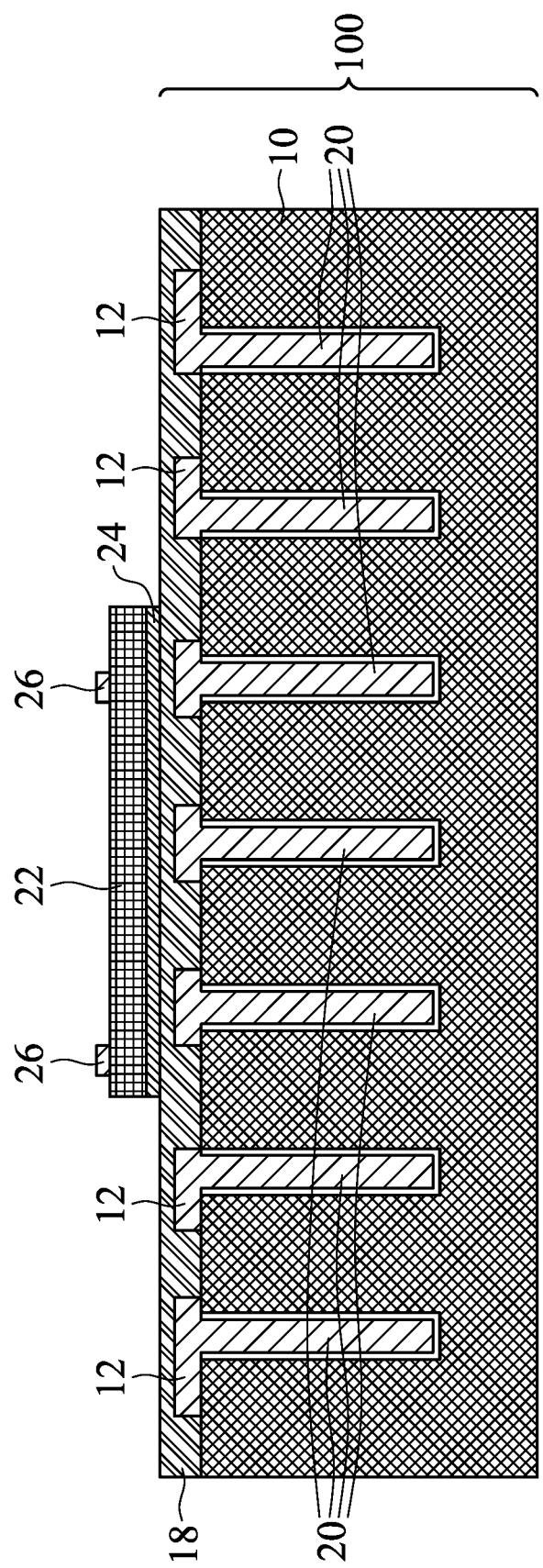

Next, as shown in FIG. 1B, die 22 is attached on dielectric layer 18, for example, through adhesive 24, with bond pads (or metal bumps) 26 facing away from dielectric layer 18. Although only one die 22 is illustrated, a plurality of identical dies 22 may be bonded to interposer wafer 100. Die 22 may be a device die comprising integrated circuit devices, such as transistors, capacitors, inductors, resistors (not shown), and the like, therein. Further, die 22 may be a logic die comprising core circuits, or a memory die. Die 22 may also be referred to as a tier-2 die hereinafter.

Figure 1C:
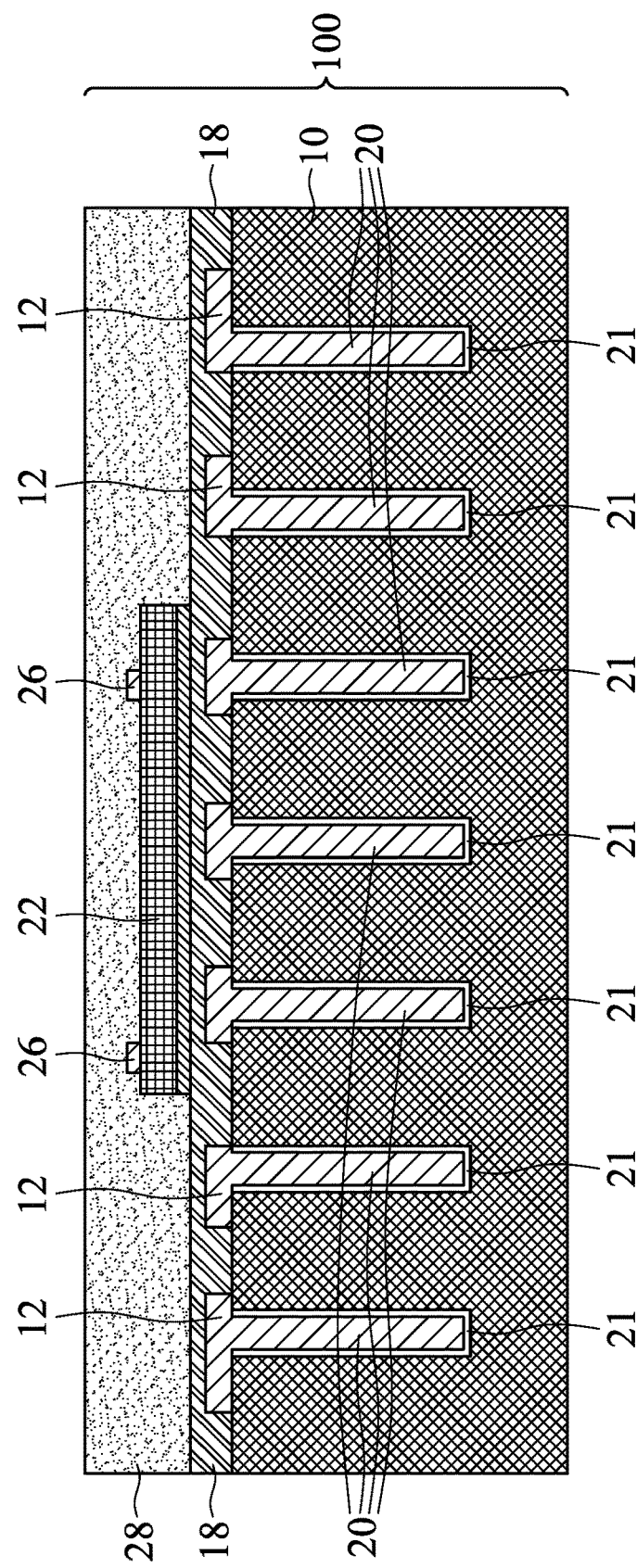
Figure 1D:
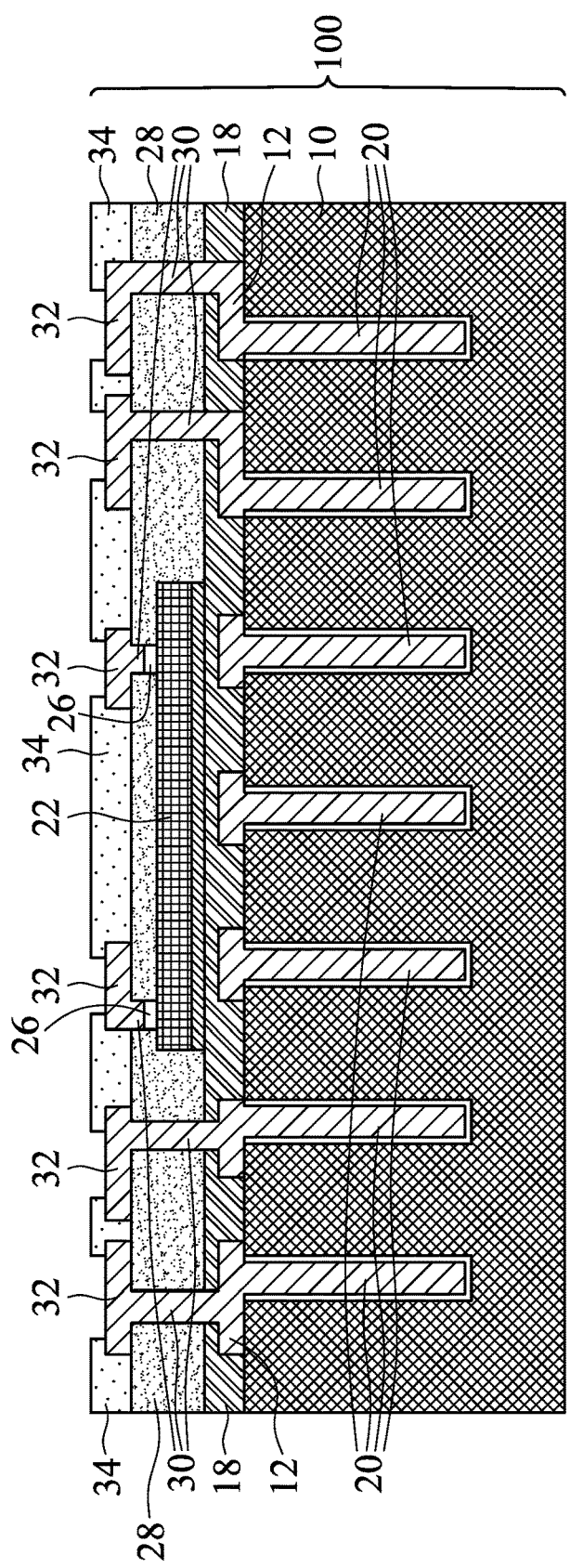

In FIG. 1C, dielectric layer 28 is formed over dielectric layer 18 and die 22. The materials for forming dielectric layer 28 may be essentially the same as, or selected from the same group as, that of dielectric layer 18. Dielectric layer 28 will thus comprise a first portion covering die 22, and a second portion encircling die 22. Next, as shown in FIG. 1D, vias 30, RDLs 32, and dielectric layer 34 are formed. In an exemplary formation process, via openings (filled by vias 30) are first formed in dielectric layers 18 and 28, for example, by etching, with the metal pads in RDLs 12 and bond pads 26 of die 22 acting as etching stop layers. The via openings are then filled by a metallic material to form vias 30. RDLs 32 are then formed. In alternative embodiments, vias 30 and RDLs 32 may be formed in a same metal-filling process. Dielectric layer 34 is formed over RDLs 32. Openings are then formed in dielectric layer 34, wherein the exposed portions of RDLs 32 act as bond pads. RDLs 32 may be formed of copper, although other metals such as aluminum, silver, tungsten, titanium, tantalum, and/or the like may also be used. Further, RDLs 32 may have a composite structure including a copper layer and a metal finish on the copper layer, wherein the metal finish may include a nickel layer, a palladium layer, a gold layer, or combinations thereof. Dielectric layers 18 and 28 and RDLs 12 and 32 in combinations may be referred to as an interconnect structure hereinafter.

Figure 1E:
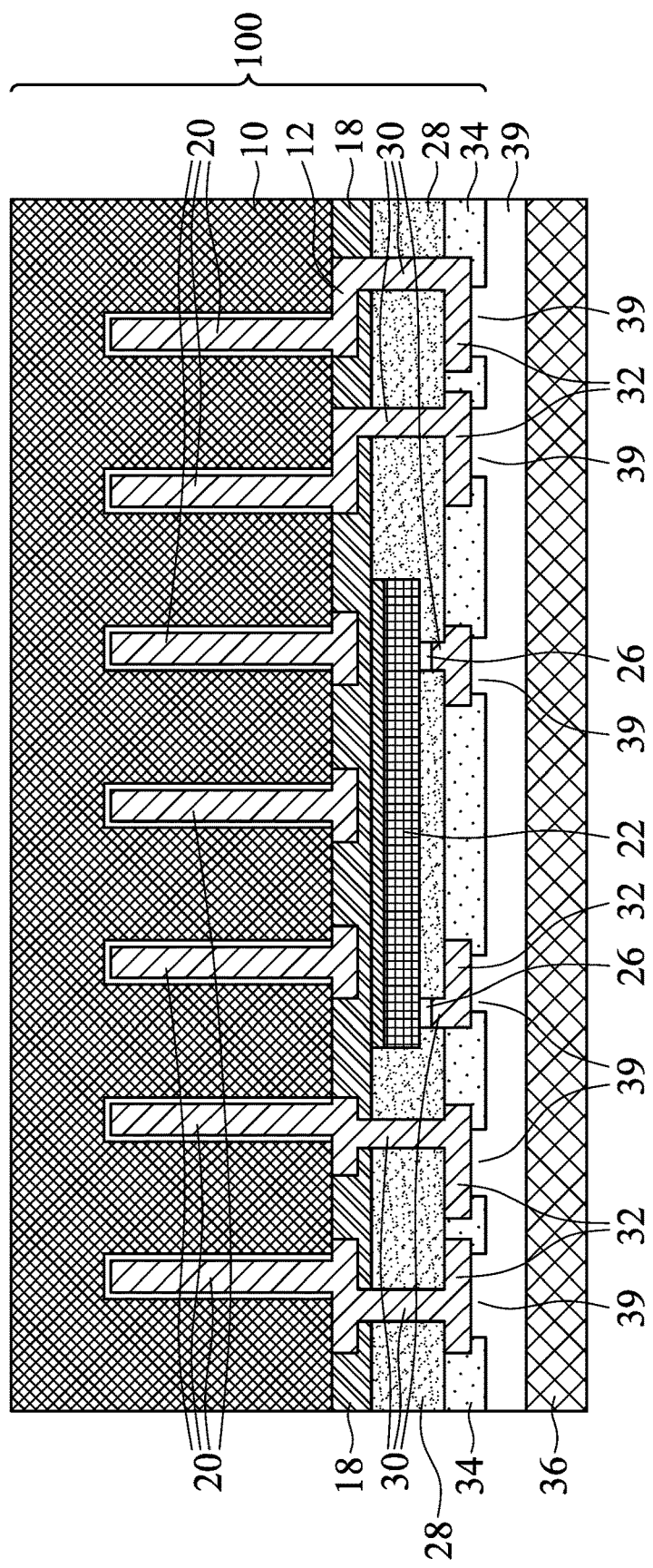
Figure 1F:
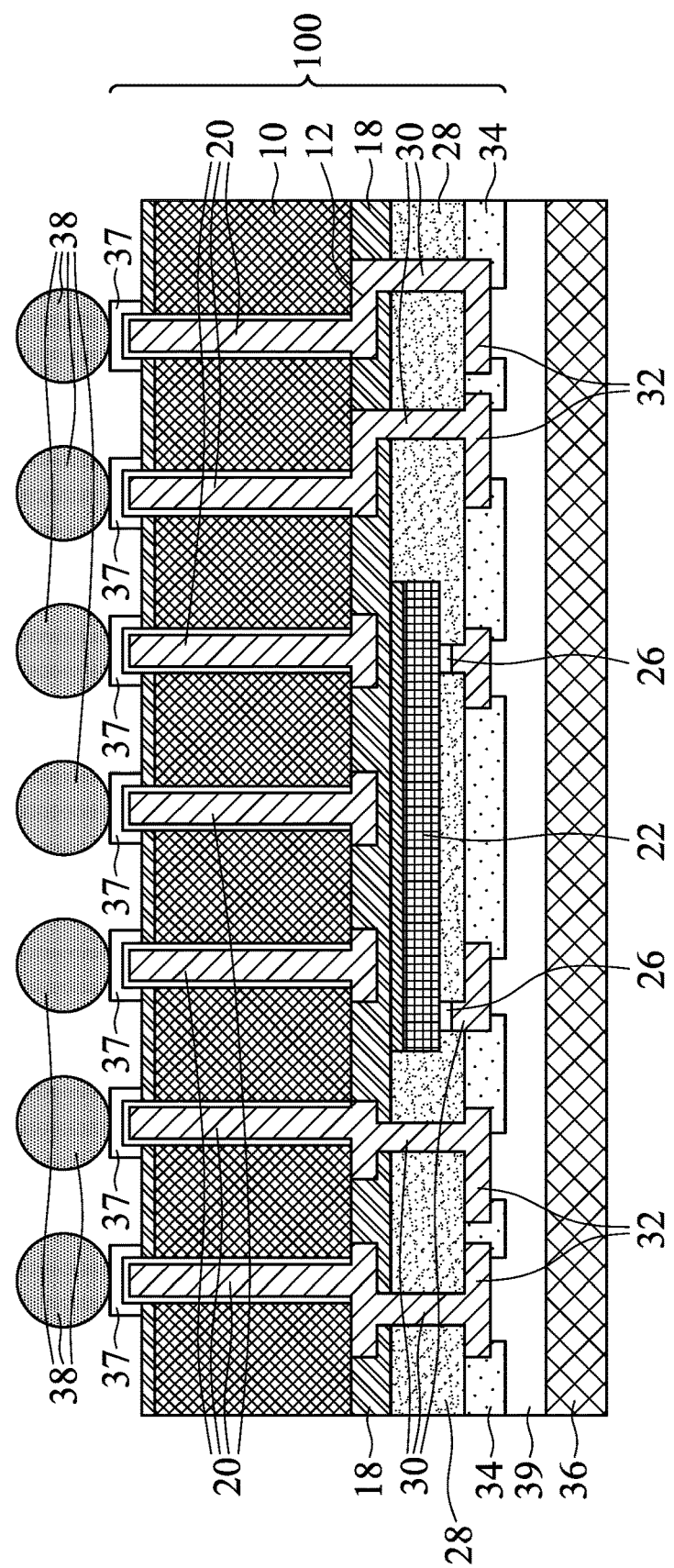

Referring to FIG. 1E, carrier 36, which may be a glass wafer, is bonded onto the front side of interposer wafer 100 through adhesive 39, which may be an ultra-violet (UV) glue, or formed of other known adhesive materials. Next, as shown in FIG. 1F, wafer backside grinding is performed to thin substrate 10 from the backside, until TSVs 20 are exposed. An etch may be performed to further reduce the back surface of substrate 10 so that TSVs 20 protrude out of the back surface of the remaining portion of substrate 10.

As also shown in FIG. 1F, under-metal-metallurgies (UBMs) 37 and backside metal bumps 38 are formed on the backside of interposer wafer 100, and are electrically coupled to TSVs 20. Backside metal bumps 38 may be solder bumps such as eutectic solder bumps, copper bumps, or other metal bumps formed of gold, silver, nickel, tungsten, aluminum, and/or alloys thereof. The formation process may include plating, which may include electro plating or electroless plating.

It is noted that although backside metal bumps 38 are illustrated as being formed directly on TSVs 20, an additional backside interconnect structure (not shown) may be formed between, and electrically coupling, backside metal bumps 38 and TSVs 20. The backside interconnect structure may include one or more layer of RDLs, each formed in one dielectric layer.

Figure 1G:
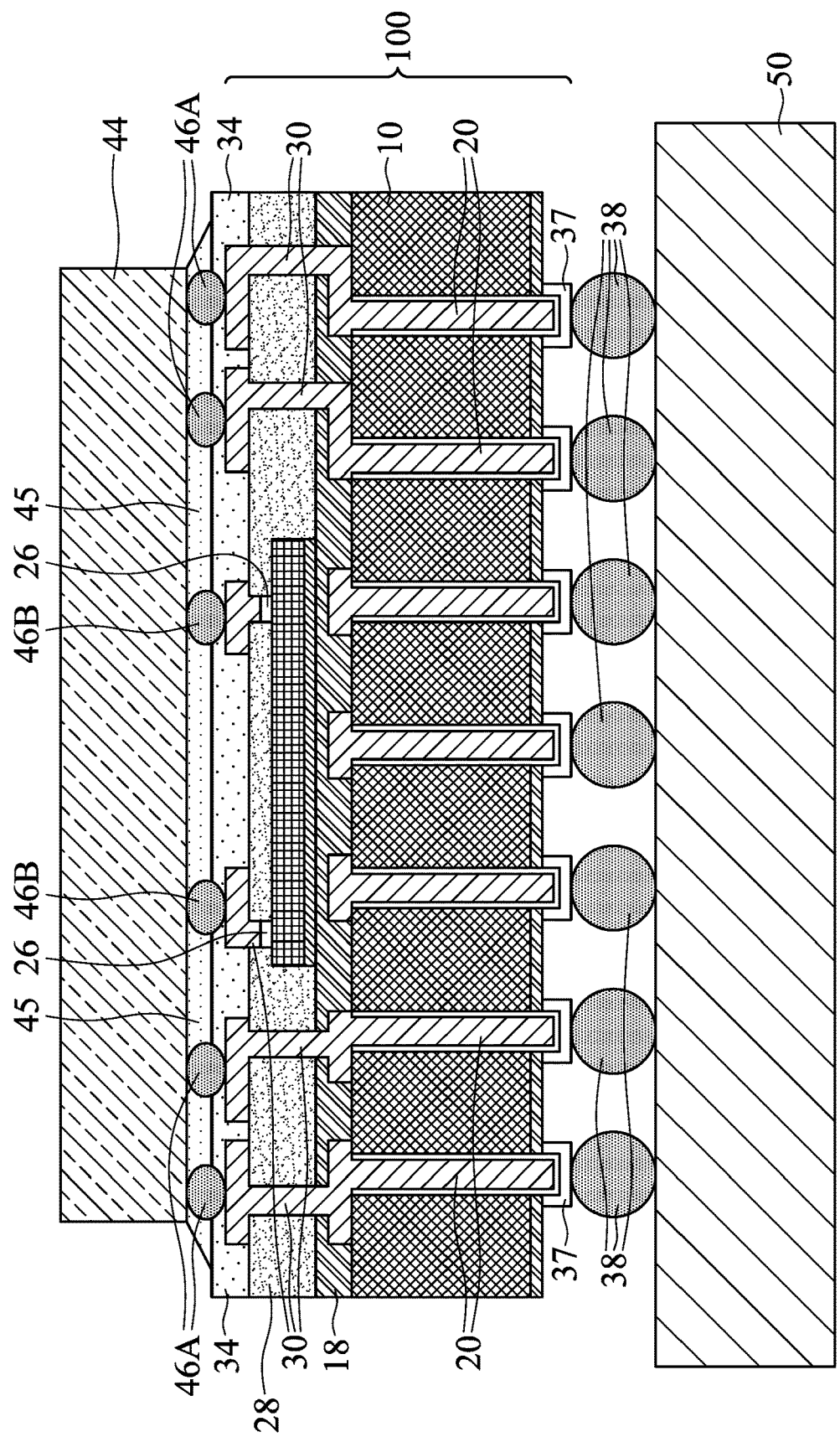

Referring to FIG. 1G, carrier 36 is de-bonded, and another carrier (not shown) may be bonded to metal bumps 38. Bumps 46 (including bumps 46A and 46B) may then be bonded to the front side of interposer wafer 100. Bumps 46 may be solder bumps, for example, although they can also be copper bumps. Tier-1 die 44 is then bonded to interposer wafer 100 through bumps 46 using a face-to-face bonding. Although only one die 44 is illustrated, there may be a plurality of dies 44 bonded to interposer wafer 100. Tier-1 die 44 and tier-2 die 22 may be different types of dies. For example, Tier-1 die 44 may be a logic die, while tier-2 die 22 may be a memory die. It is observed that bumps 46A may be used to electrically coupling tier-1 die 44 to interposer wafer 100, while bumps 46B are used to electrically couple tier-1 die 44 to tier-2 die 22. Accordingly, dies 22 and 44 may communicate with each other directly, while the signals do not need to be routed through RDLs, TSVs, and/or the like.

After the bonding of tier-1 die 44, underfill 45 is filled into the gap between tier-1 die 44 and interposer wafer 100. A singulation may be performed on interposer wafer 100, and interposer wafer 100 is sawed apart, so that dies are separated from each other, with each of dies comprising one of dies 22 and interposer 100' (FIG. 1G). In alternative embodiments, the singulation may be performed before bonding tier-1 die(s) 44 onto interposer wafer 100.

Next, as also shown in FIG. 1G, the 3DIC including the interposer 100' and dies 22 and 44 are bonded to electrical component 50 through bumps 38. Electrical component 50 is underlying the interposer 100'. Electrical component 50 may be a package substrate, a printed circuit board (PCB), or the like.

Figure 2A:
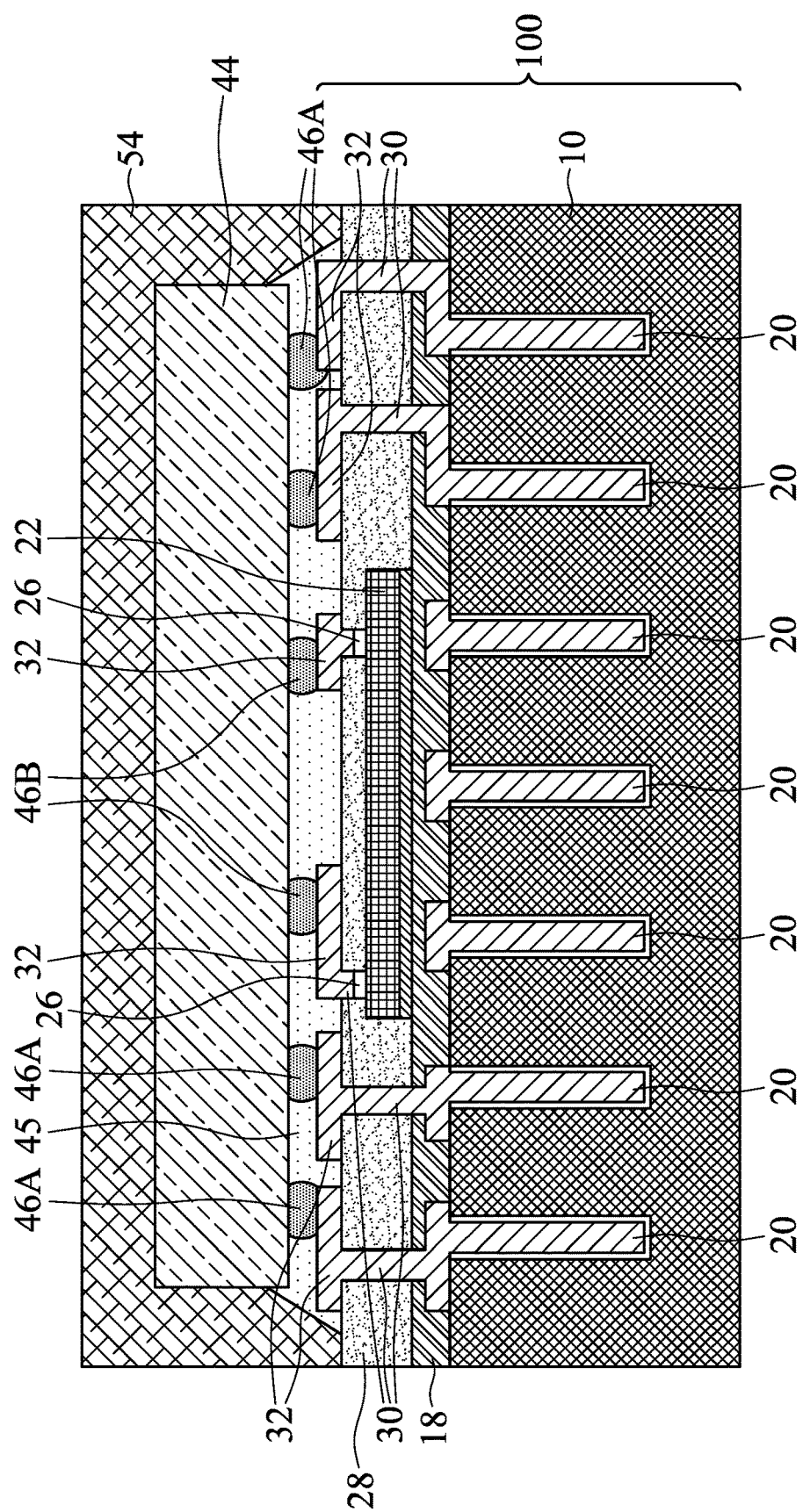
FIGS. 2A through 2C are cross-sectional views of intermediate stages in the manufacturing of a 3DIC in accordance with various embodiments, wherein a tier-1 die and the respective molding compound are bonded/applied onto an interposer before solder bumps are formed on an opposite side of the interposer.
Figure 2B:
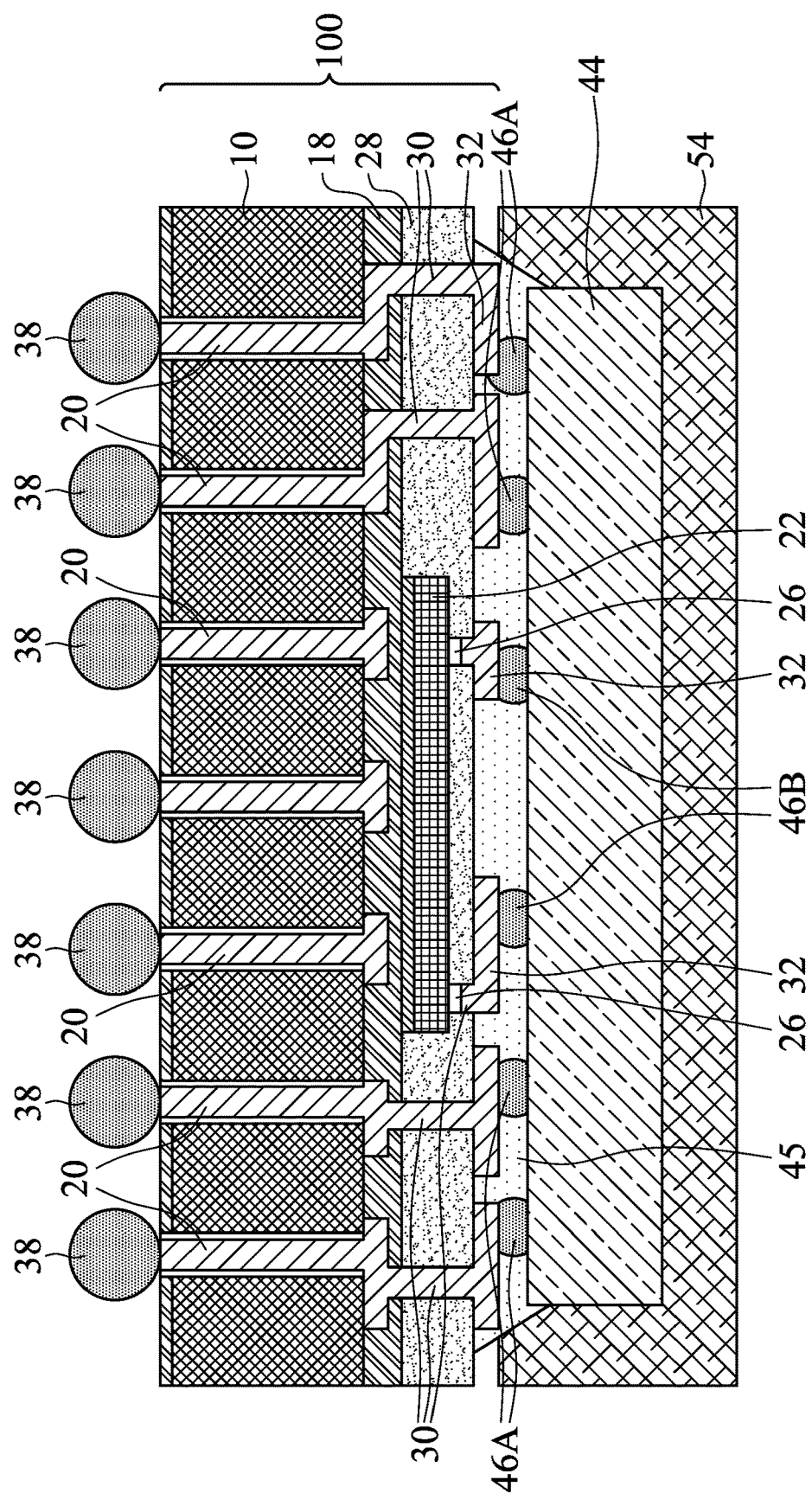
Figure 2C:
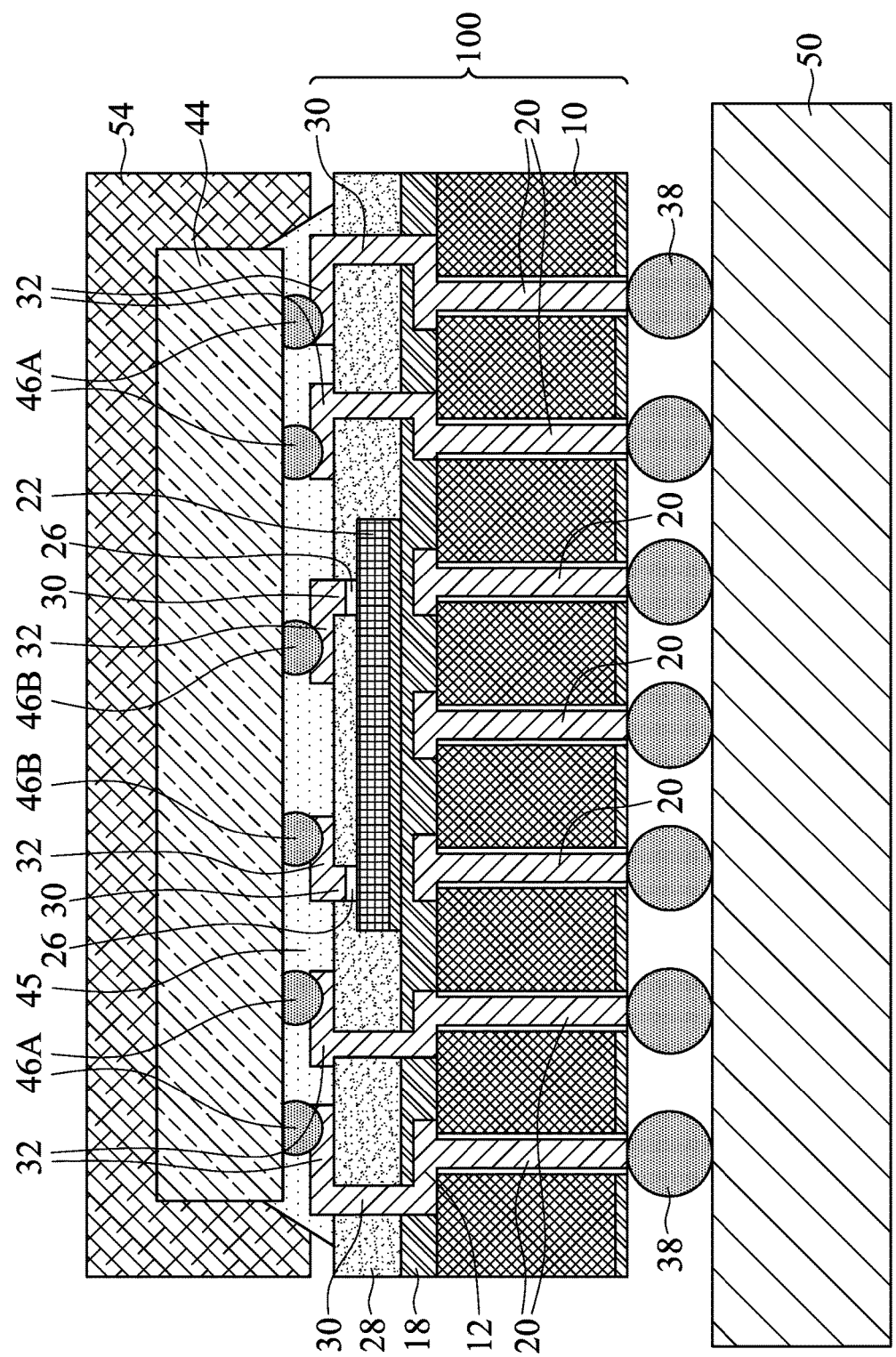

FIGS. 2A through 2C illustrate an alternative embodiment. Unless specified otherwise, the reference numerals in these embodiments represent like elements in the embodiments illustrated in FIGS. 1A through 1G. The initial steps of this embodiment are essentially the same as shown in FIGS. 1A through 1D. For simplicity, some of the features such as dielectric layer 34 and UBMs 37 are not shown in subsequently discussed embodiments, although they may also be formed. Next, as shown in FIG. 2A, bumps 46 are formed, and tier-1 die 44 is bonded to interposer wafer 100. Although only one tier-1 die 44 is illustrated, a plurality of identical tier-1 dies 44 may be bonded to interposer wafer 100. Again, bumps 46A may be used to electrically couple tier-1 die 44 to TSVs 20, while bumps 46B may be used to electrically couple tier-1 die 44 to tier-2 die 22. Underfill 45 may be filled into the gap between tier-1 die 44 and interposer wafer 100. Molding compound 54 is then formed to cover tier-1 die 44 and interposer wafer 100.

FIG. 2B illustrates the formation of bumps 38, during which molding compound 54 is used as a carrier, with no additional carrier being used and attached to molding compound 54. Next, a singulation is performed to separate interposer wafer 100 (and dies 22 and 44 bonded thereon) into dies. The 3DIC is then bonded onto electrical component 50, as shown in FIG. 2C.

Figure 3A:
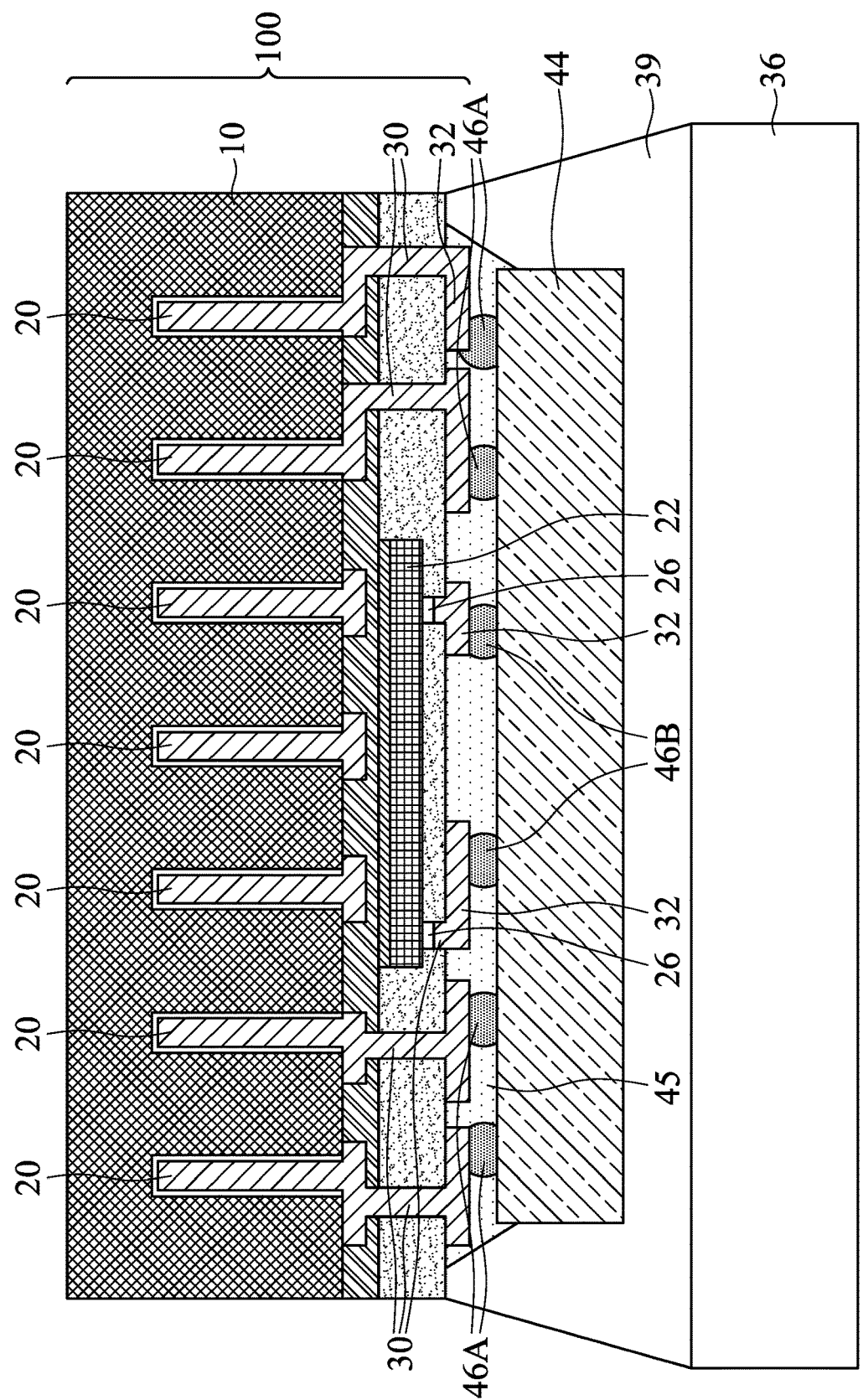
FIGS. 3A through 3C are cross-sectional views of intermediate stages in the manufacturing of a 3DIC in accordance with various embodiments, wherein a tier-1 die (with no molding compound applied) is bonded to an interposer after solder bumps are formed on an opposite side of the interposer.
Figure 3B:
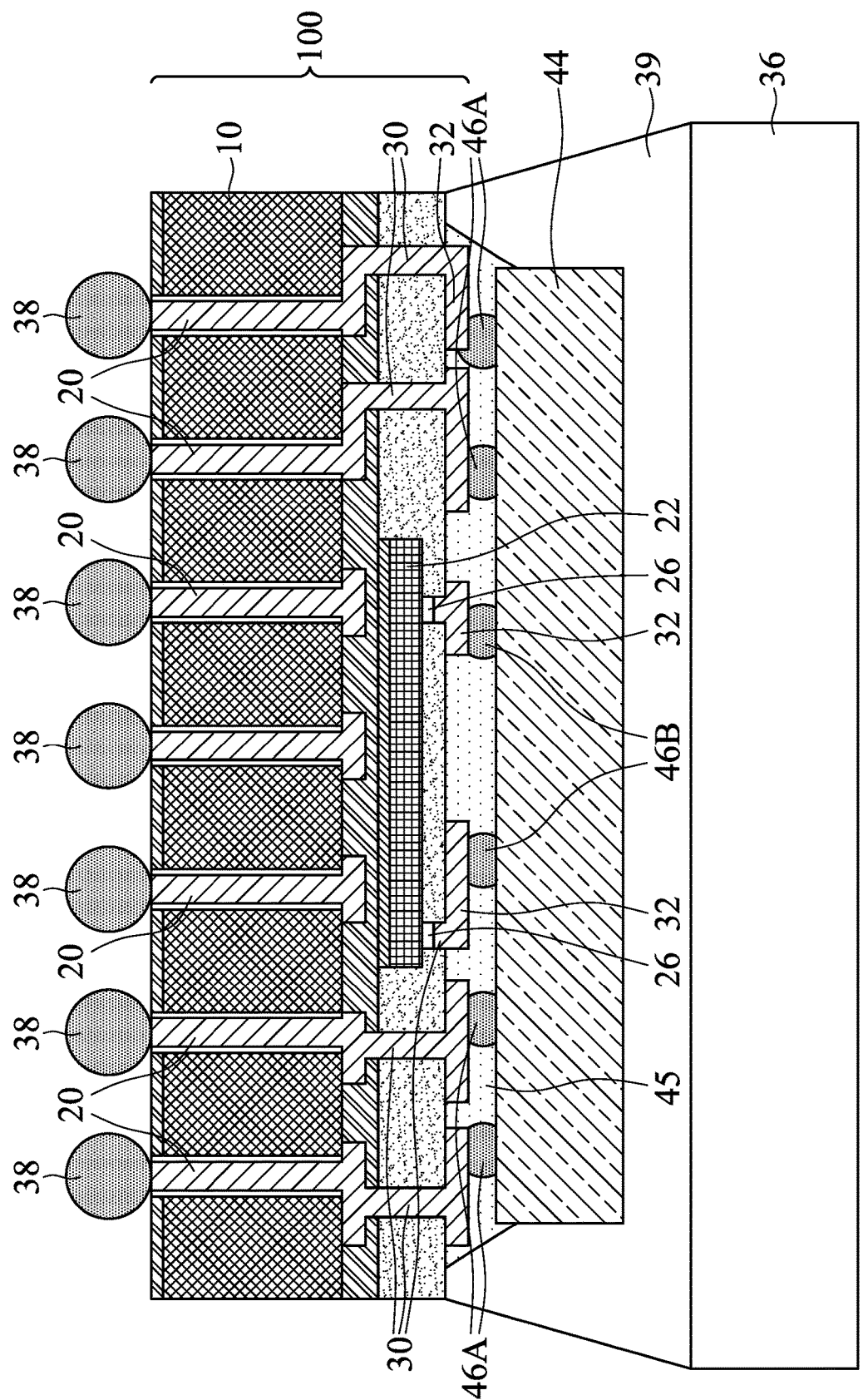
Figure 3C:
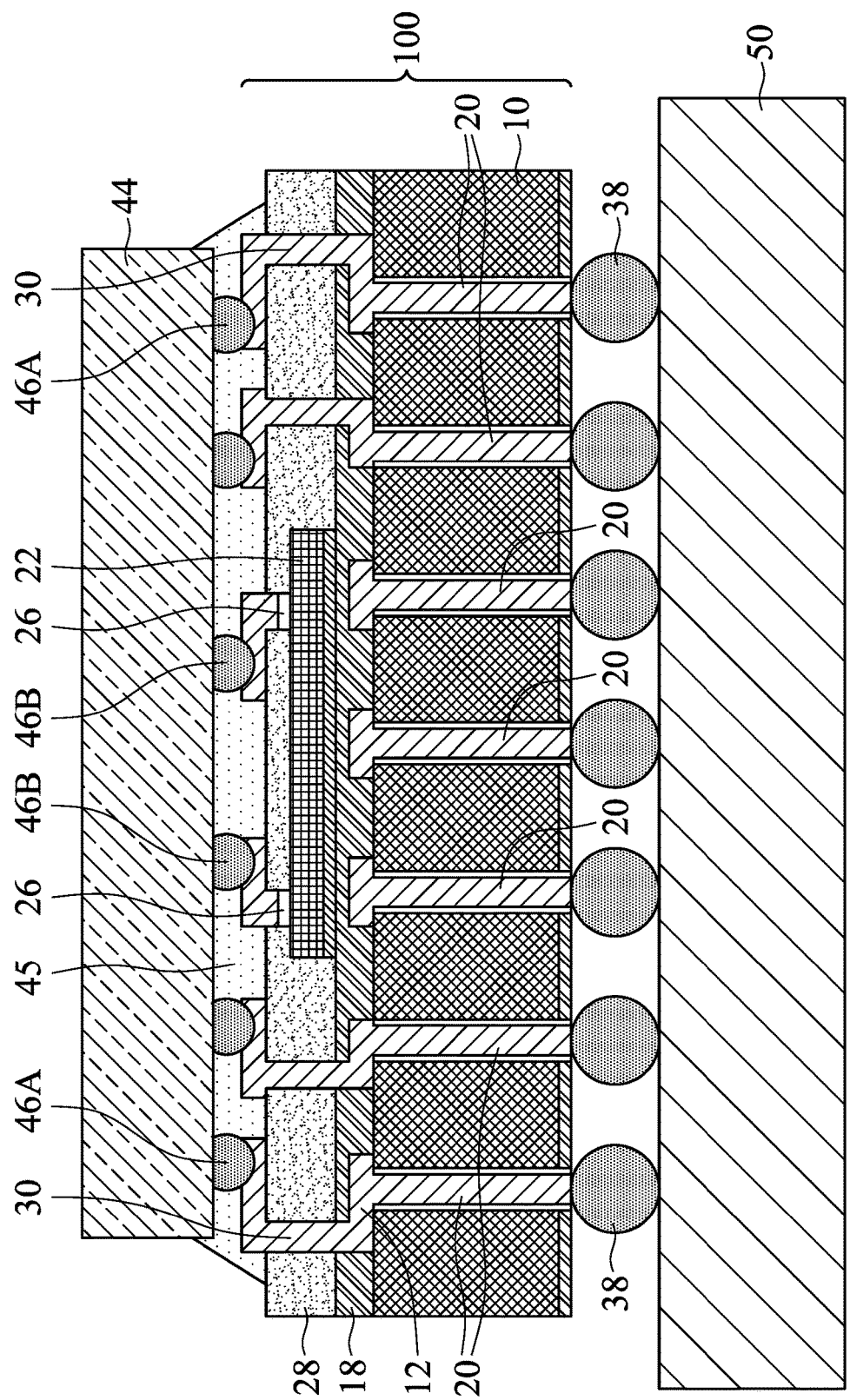

FIGS. 3A through 3C illustrate yet another embodiment. Again, the reference numerals in these embodiments represent like elements as in the embodiments illustrated in FIGS. 1A through 1G. The initial steps of this embodiment are essentially the same as shown in FIGS. 1A through 1D. Next, as shown in FIG. 3A, tier-1 die 44 is bonded to interposer wafer 100. Similarly, bumps 46A may be used to electrically couple tier-1 die 44 to TSVs 20, while bumps 46B may be used to electrically couple tier-1 die 44 to tier-2 die 22. Underfill 45 is then filled into the gap between tier-1 die 44 and interposer wafer 100. Compared to the embodiments shown in FIG. 2A, it is observed that no molding compound is formed in this embodiment. Next, carrier 36 is bonded to tier-1 die(s) 44. FIGS. 3B and 3C illustrate the formation of bumps 38 and the bonding of the resulting 3DIC onto electrical component 50. Again, a singulation may be performed before the step shown in FIG. 3C is performed, and the singulation may be performed with carrier 36 attached thereon, or after carrier 36 is replaced with a dicing tape (not shown).

Figure 4:
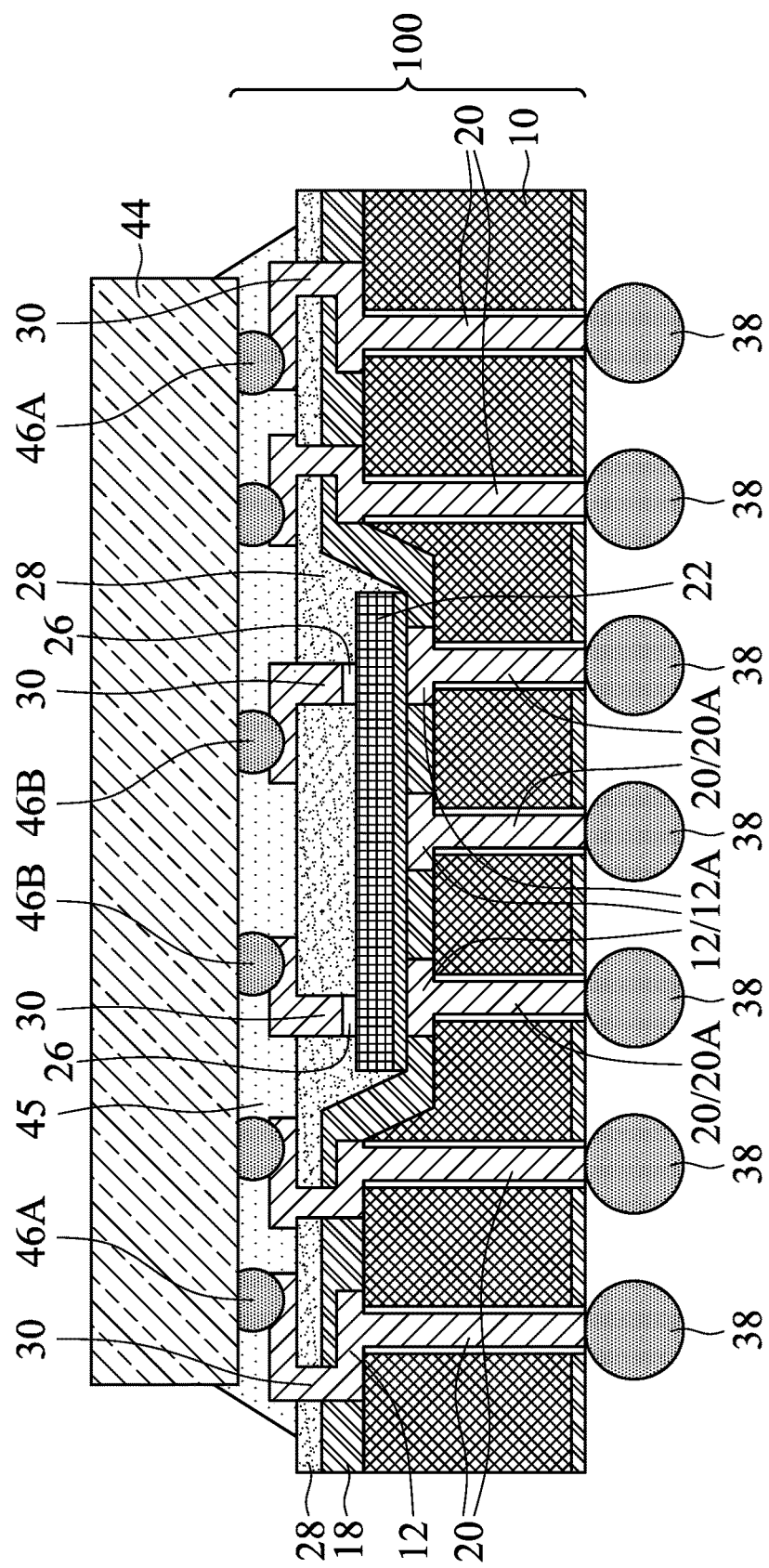
FIGS. 4 through 6 are cross-sectional views of 3DICs in accordance with various alternative embodiments.
Figure 5:
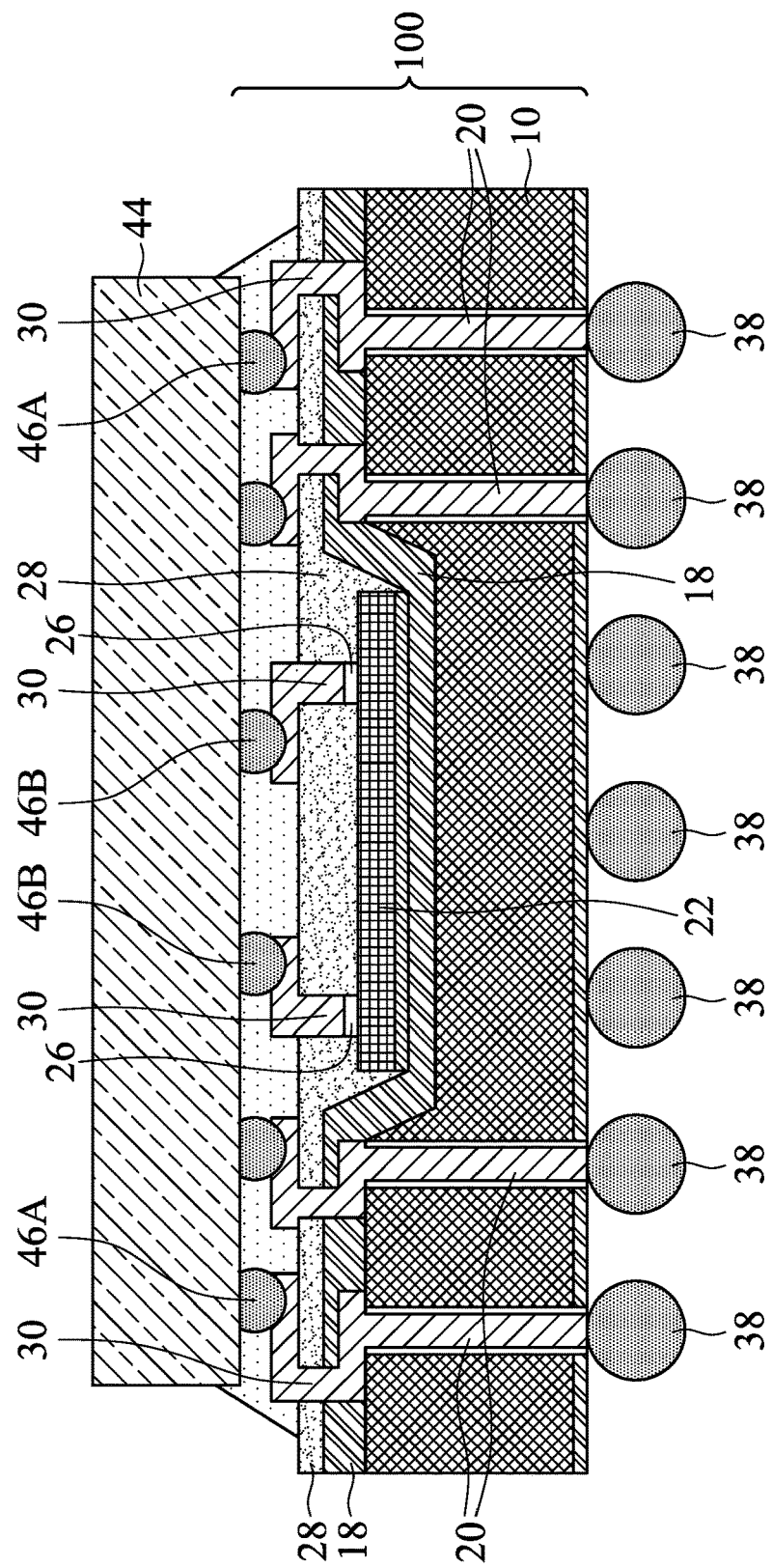
Figure 6:
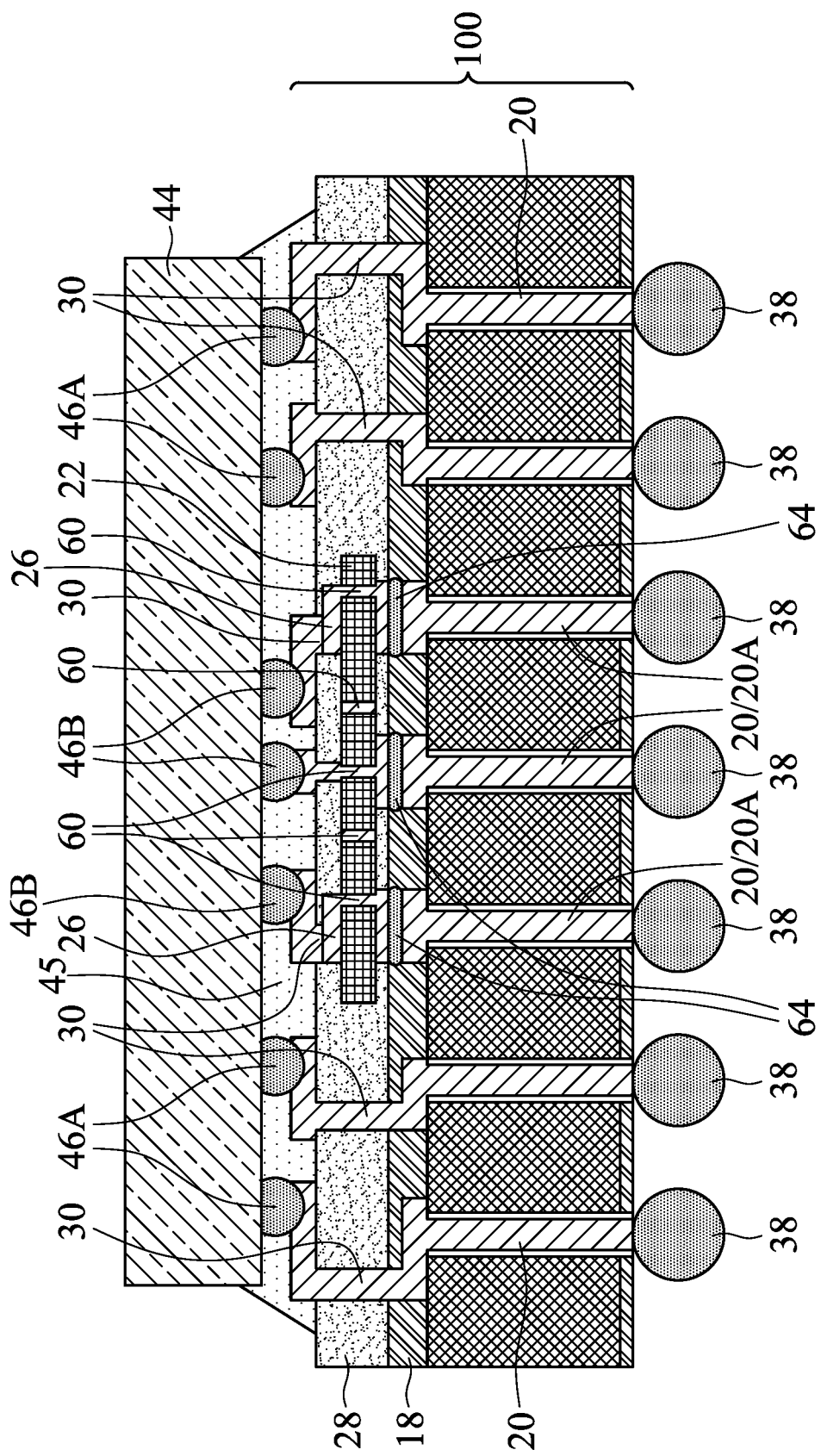

FIGS. 4 through 6 illustrate various alternative embodiments. Referring to FIG. 4, in the embodiments in which tier-2 die 22 is not thin enough to fit in dielectric layers 18 and 28, a recess (filled by die 22 and dielectric layers 18 and 28) may be formed in substrate 10 before the formation of TSVs 20. Die 22 is located either partially or fully in the recess in substrate 10. The remaining formation processes of the 3DIC may be essentially the same as illustrated in FIGS. 1A through 3C. It is observed that in FIG. 4, some of TSVs (marked as TSVs 20A) are located directly under die 22, and RDLs 12A are electrically coupled to TSVs 20. Accordingly, the space directly under die 22 may be used to route electrical signals. Alternatively, as shown in FIG. 5, no TSV and RDL are formed directly under tier-2 die 22.

FIG. 6 illustrates yet another embodiment, wherein TSVs 60 are formed in tier-2 die 22, and electrically couple tier-1 die 44 to metal bumps 38. As aforementioned, tier-2 die 22 may be a device die comprising integrated circuit devices such as transistors, capacitors, and the like. Accordingly, TSVs 60 may penetrate through a semiconductor substrate, on which the transistors are formed, in the tier-2 die 22. For example, TSVs 60 may electrically couple tier-1 die 44 to metal bumps 64, which are electrically coupled to TSVs 20A that are directly under tier-2 die 22. Metal bumps 64 may be solder bumps, copper bumps, or the like. Accordingly, a short electrical path is established to electrically couple die 22 to bumps 38, and hence the electrical performance of the resulting 3DIC is improved. It is noted in the embodiment shown in FIG. 6, a recess (not shown) similar to the recess shown in FIGS. 4 and 5 may also be formed, with die 22 being at least partially, and possibly fully, in the recess.

In the embodiments, tier-1 die 44 and tier-2 die 22 are bonded to the same side of an interposer, and hence tier-1 die 44 and tier-2 die 22 may talk directly through their direct bonding. On the other hand, with both dies 44 and 22 on a same side, the opposite side of the interposer does not have to have any die bonded thereon, and hence the number of allowed metal bumps is maximized. Furthermore, the form factor is improved.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    an interposer comprising:
        a semiconductor substrate;
        a first through-via penetrating through the semiconductor substrate; and
        a plurality of Redistribution Lines (RDLs) over and electrically coupling to the first through-via;
    a first package component over and bonded to the interposer, wherein the first package component is electrically coupled to the first through-via; and
    a second package component embedded in the interposer and over the semiconductor substrate, wherein the plurality of RDLs comprises an RDL overlapping the second package component, and the RDL contacts the second package component; and
    a third package component underlying and bonded to the interposer.

2. The package of claim 1, wherein the first package component and the second package component comprise a first device die and a second device die, respectively.

3. The package of claim 1, wherein the third package component comprises a package substrate.

4. The package of claim 1, wherein the third package component comprises a printed circuit board (PCB).

5. The package of claim 1, wherein the second package component comprises:
    an additional semiconductor substrate; and
    additional through-vias penetrating through the additional semiconductor substrate.

6. The package of claim 1, wherein the semiconductor substrate has a recess extending from a top surface of the semiconductor substrate into the semiconductor substrate, wherein a portion of the second package component extends into the recess.

7. The package of claim 6 further comprising a dielectric layer over the semiconductor substrate, with portions of the plurality of RDLs in the dielectric layer, wherein the dielectric layer comprises a portion extending into the recess.

8. The package of claim 1 further comprising an adhesive film, wherein the second package component is adhered to the interposer through the adhesive film.

9. The package of claim 1 further comprising an additional dielectric layer encapsulating the second package component therein.

10. The package of claim 9 further comprising a second through-via penetrating through the additional dielectric layer and electrically coupling to the first through-via.

11. A package comprising:
    an interposer comprising:
        a substrate;
        a first plurality of through-substrate vias (TSVs) penetrating through the substrate;
        a plurality of redistribution lines (RDLs) over the substrate and electrically coupling to the first plurality of TSVs; and
        a dielectric layer over the substrate, with portions of the plurality of RDLs extending into the dielectric layer;
    an adhesive film over and contacting the dielectric layer;
    a first device die embedded in the interposer, wherein a back surface of the first device die contacts the adhesive film, and wherein a front surface of the first device die faces away from the adhesive film, with electrical conductive features of the first device die being at the front surface of the first device die; and a second device die over and electrically coupling to the interposer.

12. The package of claim 11, wherein the first device die is electrically coupled to the second device die through the electrical conductive features at the front surface of the first device die.

13. The package of claim 11 further comprising an additional dielectric layer encapsulating the first device die therein, wherein the additional dielectric layer and the adhesive film are formed of different materials.

14. The package of claim 13, wherein the additional dielectric layer extends from a first level higher than a top surface of the first device die to a second level lower than a bottom surface of the first device die.

15. The package of claim 13, wherein the additional dielectric layer further encapsulates the adhesive film therein.

16. The package of claim 11, wherein at least a portion of the adhesive film is in the substrate of the interposer.

17. A device comprising:
an interposer substantially free from integrated circuit devices, wherein the interposer comprises:
a silicon substrate;
a first plurality of through-vias in the silicon substrate; and
a first dielectric layer over the silicon substrate, wherein the first dielectric layer extends into a recess in the silicon substrate;
a device die over and bonded to the first dielectric layer, wherein a portion of the device die is in the recess; and
a package component underlying and bonded to the interposer, wherein the package component comprises a package substrate or a printed circuit board.

18. The device of claim 17 further comprising a second dielectric layer, with an entirety of the device die in the second dielectric layer.

19. The device of claim 18 further comprising a second plurality of through-vias penetrating through the second dielectric layer and electrically coupling to portions of the first plurality of through-vias.

20. The device of claim 17 further comprising an adhesive film in a recess in the silicon substrate.

\* \* \* \* \*